US010865139B2

(12) United States Patent
Ishitsuka et al.

(10) Patent No.: US 10,865,139 B2
(45) Date of Patent: Dec. 15, 2020

(54) LARGE-SIZE SYNTHETIC QUARTZ GLASS SUBSTRATE, EVALUATION METHOD, AND MANUFACTURING METHOD

(71) Applicant: Shin-Etsu Chemical Co., Ltd., Tokyo (JP)

(72) Inventors: Yoko Ishitsuka, Joetsu (JP); Atsushi Watabe, Joetsu (JP); Daijitsu Harada, Joetsu (JP); Masaki Takeuchi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/972,416

(22) Filed: May 7, 2018

(65) Prior Publication Data

US 2018/0319705 A1 Nov. 8, 2018

(30) Foreign Application Priority Data

May 8, 2017 (JP) .................... 2017-092330

(51) Int. Cl.
| | |
|---|---|
| *C03C 19/00* | (2006.01) |
| *G01B 5/28* | (2006.01) |
| *G03F 1/60* | (2012.01) |
| *C03C 3/06* | (2006.01) |
| *B24B 1/00* | (2006.01) |

(52) U.S. Cl.
CPC ............. *C03C 19/00* (2013.01); *B24B 1/00* (2013.01); *C03C 3/06* (2013.01); *G01B 5/285* (2013.01); *G03F 1/60* (2013.01); *C03C 2204/08* (2013.01)

(58) Field of Classification Search
CPC ........... G01N 21/9501; G01N 21/956; G01N 2021/8861; G01N 2021/8867; G01N 2021/9513; G01B 21/30; G01B 5/28; G01B 5/285; H01L 22/12; H01L 21/67288;
(Continued)

(56) References Cited

U.S. PATENT DOCUMENTS

| | | | | |
|---|---|---|---|---|
| 4,255,055 A | * | 3/1981 | Schave | ................ G01B 11/306 356/237.2 |
| 6,583,050 B2 | * | 6/2003 | Wenski | ................ B24B 37/042 438/626 |

(Continued)

FOREIGN PATENT DOCUMENTS

| | | |
|---|---|---|
| JP | 2004-200600 A | 7/2004 |
| JP | 2006-176341 A | 7/2006 |

(Continued)

OTHER PUBLICATIONS

Japanese Office Action for Japanese Application No. 2017-092330, dated Feb. 18, 2020.

*Primary Examiner* — Natalie Huls
(74) *Attorney, Agent, or Firm* — Birch, Stewart, Kolasch & Birch, LLP

(57) ABSTRACT

A large-size synthetic quartz glass substrate has a diagonal length of at least 1,000 mm. Provided that an effective range is defined on the substrate surface, and the effective range is partitioned into a plurality of evaluation regions such that the evaluation regions partly overlap each other, a flatness in each evaluation region is up to 3 μm. From the quartz glass substrate having a high flatness and a minimal local gradient within the substrate surface, a large-size photomask is prepared.

7 Claims, 1 Drawing Sheet

(58) Field of Classification Search
CPC ....... C03C 3/06; C03C 19/00; C03C 2204/08; B24B 1/00
See application file for complete search history.

(56) References Cited

U.S. PATENT DOCUMENTS

| | | | | |
|---|---|---|---|---|
| 7,230,680 B2* | 6/2007 | Fujisawa | ............. | G01B 11/306 355/53 |
| 7,330,042 B2* | 2/2008 | Fukazawa | ............ | G01N 21/956 250/559.44 |
| 7,455,785 B2* | 11/2008 | Koike | .................... | B24B 37/30 216/12 |
| 7,877,722 B2* | 1/2011 | Duffy | .................... | G03F 7/7065 716/55 |
| 8,041,103 B2* | 10/2011 | Kulkarni | ............ | G06F 17/5045 382/144 |
| 8,165,706 B2* | 4/2012 | Pitney | ................... | G01B 21/30 700/105 |
| 8,340,801 B2* | 12/2012 | Pitney | ................... | G01B 21/30 700/105 |
| 9,536,299 B2* | 1/2017 | Park | ........................ | G06T 7/001 |
| 9,710,903 B2* | 7/2017 | Fouquet | ................ | G06T 7/0006 |
| 10,365,232 B2* | 7/2019 | Suman | ............... | G01N 21/9501 |
| 2003/0023402 A1* | 1/2003 | Kobayashi | ............. | G01B 21/30 702/167 |
| 2009/0016595 A1* | 1/2009 | Peterson | ................... | G03F 1/84 382/144 |
| 2010/0309308 A1* | 12/2010 | Saphier | ................ | G06T 7/0004 348/92 |
| 2017/0076435 A1* | 3/2017 | Park | ................... | G01N 21/9501 |

FOREIGN PATENT DOCUMENTS

| | | |
|---|---|---|
| JP | 2008-230893 A | 10/2008 |
| JP | 2012-111664 A | 6/2012 |

* cited by examiner

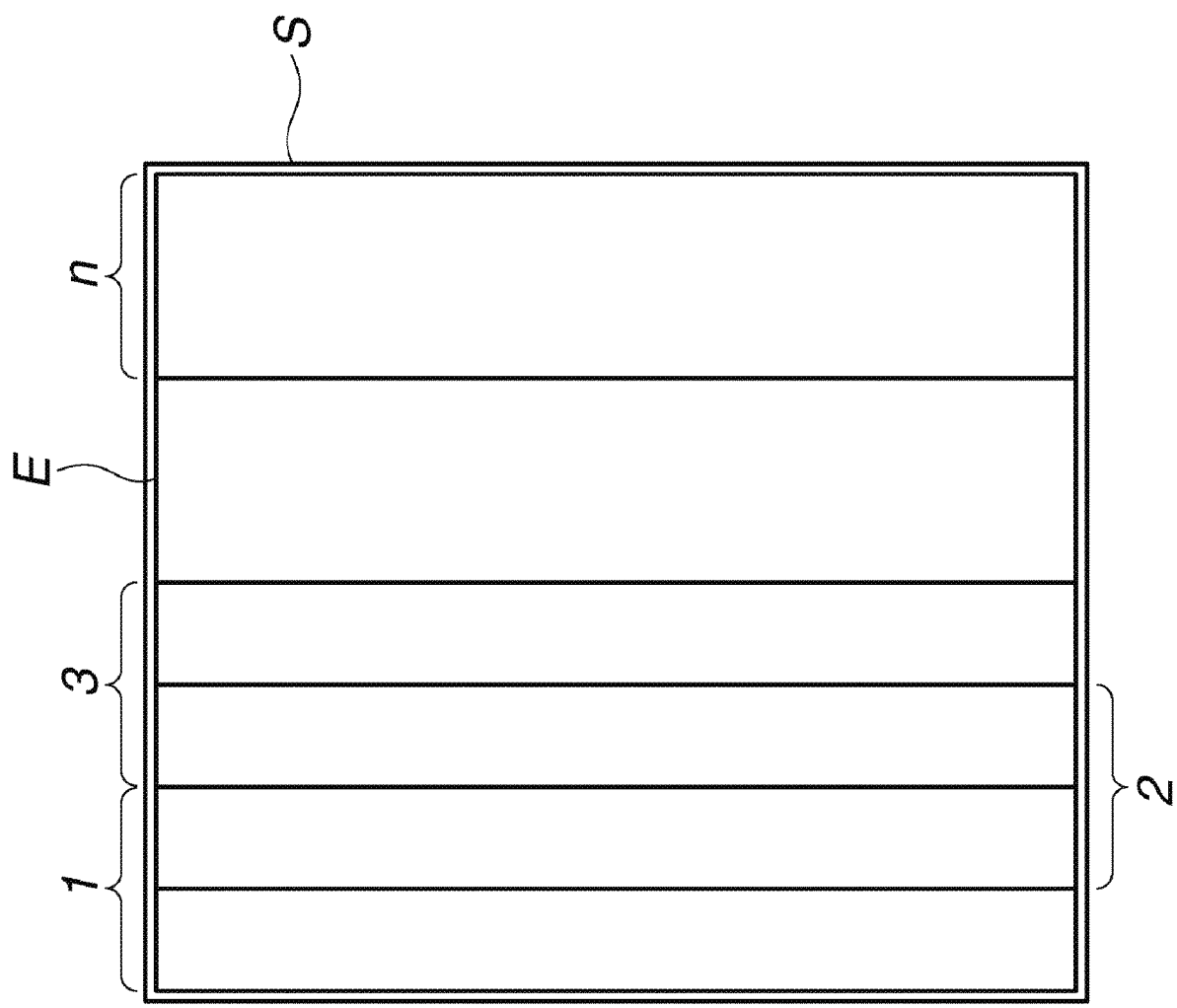

LARGE-SIZE SYNTHETIC QUARTZ GLASS SUBSTRATE, EVALUATION METHOD, AND MANUFACTURING METHOD

CROSS-REFERENCE TO RELATED APPLICATION

This non-provisional application claims priority under 35 U.S.C. § 119(a) on Patent Application No. 2017-092330 filed in Japan on May 8, 2017, the entire contents of which are hereby incorporated by reference.

TECHNICAL FIELD

This invention relates to a large-size synthetic quartz glass substrate, an evaluation method, and a manufacturing method.

BACKGROUND ART

With the recent progress in miniaturization of patterns by photolithography, the demand for high flatness to synthetic quartz glass substrates from which masks are formed is increasing. In the prior art, the specification for the flatness of substrates is generally determined by flatness values over the entire front or back surface of a substrate. However, in the field where masks of larger area are used to comply with large-size displays such as flat panel displays, not only the substrate should have a low flatness on the overall surface, but it is also important to reduce a variation of flatness within the substrate surface. Patent Document 1 discloses a method for evaluating a variation of flatness within the substrate surface by dividing the substrate into a plurality of sites and comparing local flatness within each site.

CITATION LIST

Patent Document 1: JP-A 2004-200600 (U.S. Pat. No. 7,230,680)

DISCLOSURE OF INVENTION

It is critical that the mask-forming substrate have a high flatness. Even when the flatness on the overall substrate falls within a certain specification, there is a case wherein the flatness on the overall substrate has a variation or unevenness, and the surface includes local areas having a large gradient of undulation. This leads to unevenness of a thin film deposited on the substrate or a variation of focus upon exposure through the mask. In the method of Patent Document 1, the wafer surface is divided into a plurality of sites and the flatness of each site is used in evaluation to cause the shape to approach the desired shape. Since the sites are not overlapped, but separated, the flatness between the sites such as local undulation gradient flanked with the sites is not evaluated.

An object of the invention is to provide a large-size synthetic quartz glass substrate which has a high flatness and a minimal local gradient in the substrate surface so that it is useful as a starting substrate to form a mask which allows for exposure at a high accuracy; an evaluation method; and a manufacturing method.

The inventors have found the following. In a large-size synthetic quartz glass substrate serving as a starting substrate to form a mask, an effective range is defined on the front and/or back surface. The effective range is partitioned into a plurality of evaluation regions such that the evaluation regions partly overlap each other. It is effective to evaluate flatness on the basis of flatness data within each evaluation region and further data of the difference between flatness within one evaluation region and flatness within another evaluation region overlapping the one evaluation region. By determining an amount of material removal in polishing on the basis of the evaluation result and locally polishing the substrate surface in accordance with the determined amount, a large-size synthetic quartz glass substrate is obtained which has a high flatness and a minimal local gradient in the substrate surface so that it is useful as a starting substrate to form a mask which allows for exposure at a high accuracy.

In one aspect, the invention provides a large-size synthetic quartz glass substrate having front and back surfaces and a diagonal length of at least 1,000 mm, wherein an effective range is defined on the front and/or back surface, the effective range is partitioned into a plurality of evaluation regions such that the evaluation regions partly overlap each other, and a flatness in each evaluation region is up to 3 µm.

In one preferred embodiment, the substrate is rectangular, the effective range is a rectangular range defined on the substrate surface by removing a band extending 10 mm from each side of the substrate surface, the rectangular range having two pairs of opposed sides, the evaluation region is delineated by one pair of opposed sides of the effective range and two straight lines parallel to the other pair of opposed sides and has a width of 100 to 300 mm along the one pair of opposed sides.

In one preferred embodiment, for each evaluation region, the area of the overlap between that evaluation region and the closest one of overlapping evaluation regions is 50 to 98% of the area of each evaluation region.

In one preferred embodiment, for each evaluation region, a difference in flatness between that evaluation region and the closest one of overlapping evaluation regions is up to 0.8 µm.

In another aspect, the invention provides a method for evaluating the flatness of a large-size synthetic quartz glass substrate having front and back surfaces and a diagonal length of at least 1,000 mm, wherein an effective range is defined on one or both of the front and back surfaces, the method comprising the steps of:

partitioning the effective range into a plurality of evaluation regions such that the evaluation regions partly overlap each other, measuring a flatness within each evaluation region, and optionally computing a difference between the flatness in one evaluation region and the flatness in another evaluation region overlapping the one evaluation region.

In a further aspect, the invention provides a method for manufacturing a large-size synthetic quartz glass substrate, comprising the steps of:

evaluating the flatness of a large-size quartz glass substrate according to the above method, determining an amount of material removal in polishing on the basis of the measured flatness, and locally polishing the surface of the quartz glass substrate in accordance with the determined amount of material removal in polishing.

In a still further aspect, the invention provides a method for manufacturing a large-size synthetic quartz glass substrate, comprising the steps of:

evaluating the flatness of a large-size quartz glass substrate according to the above method, determining an amount of material removal in polishing on the basis of the measured flatness and flatness difference, and locally polishing the surface of the quartz glass substrate in accordance with the determined amount of material removal in polishing.

Advantageous Effects of Invention

A large-size synthetic quartz glass substrate which has a high flatness and a minimal local gradient within the substrate surface is provided. The substrate is used to form a large-size photomask which is used in panel exposure, enabling exposure of a fine size pattern with improved critical dimension (CD) accuracy.

BRIEF DESCRIPTION OF DRAWINGS

The only FIGURE, FIG. 1 schematically illustrates one exemplary partitioning of an effective range into a plurality of evaluation regions.

DESCRIPTION OF PREFERRED EMBODIMENTS

A large-size synthetic quartz glass substrate which is used as a starting substrate to form a mask is generally prepared by furnishing a synthetic quartz glass block as prepared by the direct or indirect process, slicing the glass block to a predetermined thickness by such means as a wire saw, external shape machining to a predetermined size, grinding, lapping, rough polishing, and precision polishing. The quartz glass substrate thus obtained is typically shaped as a rectangular plate having a diagonal length of at least 1,000 mm and preferably a thickness of 5 to 30 mm. In this sense, the substrate has front and back surfaces and four sides. Typically the quartz glass substrate has a diagonal length of 3,500 mm at maximum. The quartz glass substrate over its entire surface has a flatness of preferably up to 30 μm, more preferably up to 20 μm, and even more preferably up to 10 μm on either of the front and back surfaces, and also a parallelism of preferably up to 30 μm, more preferably up to 20 μm, and even more preferably up to 10 μm between the front and back surfaces.

An effective range is defined on each of the front and back surfaces of the substrate. Specifically, the effective range is a range of the substrate surface excluding an outer peripheral portion and more specifically a range defined on the substrate surface by removing a band extending 10 mm from each side from the substrate surface. In one embodiment wherein the large-size synthetic quartz glass substrate is rectangular, a rectangular range is defined by removing a band extending 10 mm from each side. Notably, the rectangular range has two pairs of opposed sides.

According to the invention, the effective range on the front and/or back surface of the quartz glass substrate is partitioned into a plurality of evaluation regions such that the evaluation regions partly overlap each other, for example, any of evaluation regions is positioned in the overall effective range. The way of partitioning evaluation regions is described in conjunction with a rectangular large-size synthetic quartz glass substrate, for example. As shown in FIG. 1, one evaluation region is delineated by one pair of opposed sides of the effective range E on the substrate surface S and two straight lines parallel to the other pair of opposed sides of the effective range E (notably the two straight lines being inclusive of the other pair of opposed sides themselves). In this case, all evaluation regions are rectangular and juxtaposed in the order of evaluation regions 1, 2, 3, . . . , n along one pair of opposed sides. Each evaluation region has a width of at least 100 mm, especially at least 150 mm and up to 300 mm, especially up to 250 mm along one pair of opposed sides. Preferably the width is identical among all evaluation regions. That is, evaluation regions are preferably partitioned at the same pitch. The one pair of opposed sides along which evaluation regions are juxtaposed may be on either longer side or shorter side of a rectangular substrate, preferably in a direction convenient to compute polishing amounts or to measure flatness, for example, moving direction of a polishing tool or axial direction during flatness measurement.

As the degree of overlap between evaluation regions increases, the total number of evaluation regions increases, which is advantageous in that a large-size synthetic quartz glass substrate having a high flatness and minimal local gradient within the substrate surface is obtained, but disadvantageous in that a longer time is necessary for evaluation and processing. As the degree of overlap between evaluation regions lowers, the total number of evaluation regions decreases, which is advantageous in that a shorter time is taken for evaluation and processing, but ineffective in obtaining a large-size synthetic quartz glass substrate having a high flatness and minimal local gradient within the substrate surface. Therefore, an adequate degree of overlap is selected in accordance with the desired flatness and processing time. From this point of view, the degree of overlap between evaluation regions is preferably determined such that for each evaluation region, preferably commonly for all evaluation regions, the area of the overlap between that evaluation region and the closest one of overlapping evaluation regions is at least 50%, more preferably at least 60%, even more preferably at least 70% and up to 98%, more preferably up to 90%, even more preferably up to 80% of the area of each evaluation region. Reference is now made to one embodiment wherein the effective range is 800 mm on one pair of opposed sides (short side) and 900 mm on the other pair of opposed sides (long side), the evaluation region has a width or pitch of 200 mm along one pair of opposed sides, and for each evaluation region, the area of the overlap between that evaluation region and the closest one of overlapping evaluation regions is 50% of the area of each evaluation region. In this embodiment, the effective range is partitioned into seven (n=7 in total) evaluation regions 1, 2, 3, . . . , 7 whose center lines (parallel to the other pair of opposed sides) are arranged at intervals of 100 mm along one pair of opposed sides.

With respect to the measurement of flatness and parallelism of the overall effective range and each region, measurement may be performed on the front and/or back surface of the quartz glass substrate while the quartz glass substrate is held with its surface set vertical (in gravity direction). Flatness may be measured by a commercially available flatness meter. Parallelism may be measured by a micrometer. Provided that a least square plane computed from a substrate surface (on analysis) is used as a reference plane, the "flatness" as used herein is the sum of a maximum of the distance between a raised portion on an actual substrate surface (surface based on measured coordinates) and the reference surface and a maximum of the distance between a recessed portion on an actual substrate surface (surface based on measured coordinates) and the reference surface.

According to the invention, there is provided a quartz glass substrate having a flatness of up to 3 μm, preferably up to 2.5 μm and more preferably up to 2 μm in each evaluation region, preferably in all evaluation regions. In a preferred embodiment, there is provided a quartz glass substrate in which for each evaluation region, preferably for all evaluation regions, a difference in flatness between that evaluation region and the closest one of overlapping evaluation regions is up to 0.8 μm, especially up to 0.5 μm.

According to the invention, once the evaluation regions are partitioned as defined above, a large-size synthetic quartz glass substrate may be evaluated for flatness. Specifically, the invention provides a method for evaluating the flatness of a large-size synthetic quartz glass substrate having a diagonal length of at least 1,000 mm, wherein an effective range is defined on the front and/or back surface, the method comprising the steps of partitioning the effective range, preferably the entire effective range into a plurality of evaluation regions such that the evaluation regions partly overlap each other, measuring a flatness within each evaluation region, and optionally computing a difference between the flatness of one evaluation region and the flatness of an evaluation region overlapping the one evaluation region.

By evaluating the flatness of a large-size quartz glass substrate according to the above evaluation method, determining an amount of material removal in polishing on the basis of the measured flatness and optionally the computed flatness difference, and locally polishing the front or back surface of the quartz glass substrate in accordance with the determined amount of material removal in polishing, a large-size synthetic quartz glass substrate having a high flatness and a minimal local gradient within the substrate surface may be manufactured, typically a large-size synthetic quartz glass substrate in which a flatness in each evaluation region is up to 3 μm, preferably up to 2.5 μm, and more preferably up to 2 μm, and a difference in flatness between that evaluation region and the closest one of overlapping evaluation regions is up to 0.8 μm, preferably up to 0.5 μm may be manufactured.

The procedure of determining an amount of material removal in polishing from the measurement result of flatness, i.e., on the basis of the measured flatness of each evaluation region may be as follows. The procedure deals with each of partitioned evaluation regions. If the flatness of a 1-st evaluation region exceeds the target flatness, for example, in excess of 3 μm, an amount of material removal in polishing necessary to polish and remove any raised portion within that evaluation region so that the flatness may become the target flatness or less, for example, 2.5 μm or less, is determined. If the flatness of a 1-st evaluation region is equal to or less than the target flatness, for example, equal to or less than 3 μm, the amount of material removal in polishing is set zero (0), and the procedure transfers to a 2-nd evaluation region. For each of 2-nd and subsequent evaluation regions, the amount of material removal in polishing is determined as done for the 1-st region. By repeating the step of determining an amount of material removal in polishing in each evaluation region, the amounts of material removal in polishing are determined for all evaluation regions. For the overlap between two evaluation regions, an average of the amounts of material removal in polishing in the overlapping evaluation regions is calculated as the amount of material removal in polishing for the overlap. In this way, the amounts of material removal in polishing are collected for all evaluation regions.

Further, an additional amount of material removal in polishing may be determined on the basis of a difference in flatness between evaluation regions. In one embodiment, the additional amount of material removal in polishing is determined from the measured value of flatness. In another embodiment, the shape of substrate surface after polishing in the amount of material removal in polishing which is determined on the basis of the flatness of each evaluation region is simulated, and a difference between the flatness within the evaluation region resulting from the simulation and the flatness within the other evaluation region overlapping that evaluation region is calculated.

In the other embodiment, the procedure deals with each of partitioned evaluation regions. The difference between the flatness within a 1-st evaluation region and the flatness within the other evaluation region overlapping the 1-st evaluation region is computed. If this difference exceeds the target difference, for example, in excess of 0.5 μm, an additional amount of material removal in polishing necessary to polish and remove any raised portion within these two evaluation regions so that the difference may become the target difference is determined. If this difference is equal to or less than the target difference, for example, equal to or less than 0.5 μm, the additional amount of material removal in polishing is set zero (0), and the procedure transfers to a 2-nd evaluation region. For each of 2-nd and subsequent evaluation regions, the amount of material removal in polishing is determined as done for the 1-st region. By repeating the step of determining an additional amount of material removal in polishing in each evaluation region, the additional amounts of material removal in polishing are determined for all evaluation regions. In this way, the additional amounts of material removal in polishing are collected for all evaluation regions. If necessary, the additional amounts of material removal in polishing are added to the above-mentioned amounts of material removal in polishing determined on the basis of flatness of each evaluation region.

The procedure of locally polishing the quartz glass substrate in accordance with the determined amounts of material removal in polishing may be carried out using, for example, an apparatus comprising a platen for holding a large-size synthetic quartz glass substrate with its surface kept horizontal, and a polishing tool adapted to move on the quartz glass substrate to carry out local polishing. The quartz glass substrate is locally polished by changing the moving speed of the polishing tool on the substrate in accordance with the necessary amounts of material removal in polishing. The polishing tool includes, for example, a rotating shaft, a disk-shaped polishing plate, and a mechanism for pressing the polishing plate against the substrate. Specifically, an abrasive pad such as abrasive cloth is attached to the polishing plate, if necessary via an elastomer such as rubber sheet. The abrasive pad is brought in contact with the substrate while a slurry is supplied thereto. The polishing plate is preferably made of a metal material selected from among stainless steel (SUS), aluminum alloys, titanium, and brass. The polishing plate preferably has a diameter of at least 100 mm, more preferably at least 300 mm and up to 800 mm, more preferably up to 600 mm. During the polishing step, the polishing plate may be changed among those of different size in accordance with the target amount of material removal in polishing. For example, on a portion having a large difference between the flatness within an evaluation region and the flatness within another overlapping evaluation region, the polishing tool is changed to a tool of smaller size in order to enable precision control of polishing and removal, because of a greater gradient of undulation in a relatively narrow range.

The abrasive cloth may be selected from non-woven fabric, suede and expanded polyurethane, and fixedly secured to the polishing plate by an adhesive. The adhesive used herein is not particularly limited as long as it provides a sufficient bond strength to prevent separation of the abrasive cloth from the polishing plate or elastomer during polishing operation. Suitable adhesives include acrylic, epoxy and urethane base adhesives. The slurry may be abrasive grains such as silicon carbide, alumina, cerium oxide and colloidal silica dispersed in water.

After the local polishing step, the quartz glass substrate may be evaluated for flatness again. If it is confirmed as a result of this evaluation that the target flatness or the target flatness difference is not reached, an amount of material removal in polishing is determined again on the basis of this evaluation result, and local polishing step is carried out again. The flatness evaluation and local polishing steps may be repeated until the target flatness and further the target flatness difference are finally reached.

EXAMPLE

Examples of the invention are given below by way of illustration and not by way of limitation.

Example 1

A synthetic quartz glass substrate stock was lapped (or roughly polished) and precision polished on its front and back surfaces, furnishing a starting synthetic quartz glass substrate. The starting substrate was dimensioned 1,600 mm×1,800 mm×17.2 mm (thick) and had a flatness of 20 μm on the overall front surface, a flatness of 22 μm on the overall back surface, and a parallelism of 15 μm on the overall substrate. The flatness was measured by a flatness tester (Kuroda Precision Industries Ltd.), and the parallelism was measured by a micrometer (Mitsutoyo Corp.), the same hereinafter.

From the measured data of flatness and parallelism of the starting substrate, amounts of material removal in polishing necessary to achieve a flatness within 10 μm on each of overall front and back surfaces and a parallelism within 10 μm were determined. Thereafter, using an apparatus for carrying out local polishing by moving a polishing tool across the starting substrate whose surfaces were kept horizontal, polishing operation was carried out while changing the moving speed of the tool on the substrate in accordance with the determined amounts of material removal in polishing. There was obtained an intermediate substrate having a thickness of 17.0 mm, a flatness of 9 μm on the overall front surface, a flatness of 12 μm on the overall back surface, and a parallelism of 10 μm on the overall substrate.

An effective range was defined on the front and back surfaces by removing a band extending 10 mm from each side of the front or back surface. The effective range having a long side of 1,780 mm and a short side of 1,580 mm was partitioned into a plurality of evaluation regions having two pairs of opposed sides. Specifically, each evaluation region was delineated by one pair of opposed sides of the effective range on 1,780 mm long side and two straight lines parallel to the other pair of opposed sides of the effective range on 1,580 mm short side and had a width of 280 mm along the one pair of opposed sides on the long side. Center lines parallel to the other pair of opposed sides of each evaluation region on the short side were arranged in order at intervals of 10 mm along the one pair of opposed sides on the long side. In this way, 151 (in total per surface) evaluation regions were partitioned. The area of the overlap between a certain evaluation region and the closest one of overlapping evaluation regions was 96% of the area of each evaluation region.

Next, a flatness in each evaluation region was measured. For each evaluation region, a difference in flatness between that evaluation region and the closest one of overlapping evaluation regions (simply referred to as "flatness difference," hereinafter) was computed. For the purpose of obtaining a quartz glass substrate having a flatness in each evaluation region of up to 3 μm and a flatness difference of up to 0.5 μm, the results of measurement were evaluated, finding that 15 evaluation regions had a flatness in evaluation region in excess of 3 μm and 7 evaluation regions had a flatness difference in excess of 0.5 μm.

Next, an amount of material removal in polishing necessary to reduce the flatness in each evaluation region to or below 3 μm was computed. First, on the basis of the measurement data of flatness in each evaluation region, for every evaluation region, a most depressed position (or lowest point) within that evaluation region was used as the reference, a portion which was raised beyond the reference by at least 2.5 μm was regarded as a portion to be polished, and a necessary amount of material removal in polishing was determined. Then the amounts of material removal in polishing for each evaluation region were collected, determining the amounts of material removal in polishing on the overall substrate. For the overlap between two evaluation regions, an average of the amounts of material removal in polishing in the overlapping evaluation regions was calculated as the amount of material removal in polishing for the overlap.

Next, an additional amount of material removal in polishing necessary to reduce the flatness difference to or below 0.5 μm was computed. First, on the basis of the measurement data of flatness difference, for evaluation regions having a flatness difference in excess of 0.5 μm, a most depressed position (or lowest point) within these evaluation regions was used as the reference, a portion which was raised beyond the reference by at least 0.4 μm was regarded as a portion to be polished, and a necessary amount of material removal in polishing was determined. Then the additional amounts of material removal in polishing for each evaluation region were collected, determining the additional amounts of material removal in polishing on the overall substrate.

Next, on the basis of the amount of material removal in polishing determined from the flatness within each evaluation region and the additional amount of material removal in polishing determined from the flatness difference, a polishing apparatus for carrying out local polishing by moving the polishing tool having a disk-shaped polishing plate across the substrate was used to carry out local polishing on the front or back surface of the intermediate substrate. Notably, in the evaluation region to which the additional amount of material removal in polishing as determined from the flatness difference is applied, a polishing plate of diameter 200 mm was used in polishing in order to enable precision control of the amount and range of polishing, because of a greater gradient of undulation in a relatively narrow range; and in the remaining evaluation regions, a polishing plate of diameter 400 mm was used.

As a result, there was obtained a large-size synthetic quartz glass substrate having a flatness of 8 μm on the overall front surface, a flatness of 10 μm on the overall back surface, a parallelism of 9 μm on the overall substrate, a flatness within evaluation region of 2.3 μm at maximum, and a flatness difference of 0.4 μm at maximum.

Example 2

A synthetic quartz glass substrate stock was lapped (or roughly polished) and precision polished on its front and back surfaces, furnishing a starting synthetic quartz glass substrate. The starting substrate was dimensioned 800 mm×900 mm×13.2 mm (thick) and had a flatness of 15 µm on the overall front surface, a flatness of 17 µm on the overall back surface, and a parallelism of 12 µm on the overall substrate.

From the measured data of flatness and parallelism of the starting substrate, amounts of material removal in polishing necessary to achieve a flatness within 10 µm on each of overall front and back surfaces and a parallelism within 10 µm were determined. Thereafter, using an apparatus for carrying out local polishing by moving a polishing tool across the starting substrate whose surfaces were kept horizontal, polishing operation was carried out while changing the moving speed of the tool on the substrate in accordance with the determined amounts of material removal in polishing. There was obtained an intermediate substrate having a thickness of 13.0 mm, a flatness of 9 µm on the overall front surface, a flatness of 10 µm on the overall back surface, and a parallelism of 9 µm on the overall substrate.

An effective range was defined on the front and back surfaces by removing a band extending 10 mm from each side of the front or back surface. The effective range having a long side of 880 mm and a short side of 780 mm was partitioned into a plurality of evaluation regions having two pairs of opposed sides. Specifically, each evaluation region was delineated by one pair of opposed sides of the effective range on 880 mm long side and two straight lines parallel to the other pair of opposed sides of the effective range on 780 mm short side and had a width of 280 mm along the one pair of opposed sides on the long side. Center lines parallel to the other pair of opposed sides of each evaluation region on the short side were arranged in order at intervals of 50 mm along the one pair of opposed sides on the long side. In this way, 13 (in total per surface) evaluation regions were partitioned. The area of the overlap between a certain evaluation region and the closest one of overlapping evaluation regions was 82% of the area of each evaluation region.

Next, a flatness in each evaluation region was measured. For each evaluation region, a difference in flatness between that evaluation region and the closest one of overlapping evaluation regions (flatness difference) was computed. For the purpose of obtaining a quartz glass substrate having a flatness in each evaluation region of up to 3 µm and a flatness difference of up to 0.5 µm, the results of measurement were evaluated, finding that 2 evaluation regions had a flatness in evaluation region in excess of 3 µm and no evaluation regions had a flatness difference in excess of 0.5 µm.

Next, an amount of material removal in polishing necessary to reduce the flatness in each evaluation region to or below 3 µm was computed. First, on the basis of the measurement data of flatness in each evaluation region, for every evaluation region, a most depressed position (or lowest point) within that evaluation region was used as the reference, a portion which was raised beyond the reference by at least 2.5 µm was regarded as a portion to be polished, and a necessary amount of material removal in polishing was determined. Then the amounts of material removal in polishing for each evaluation region were collected, determining the amounts of material removal in polishing on the overall substrate. For the overlap between two evaluation regions, an average of the amounts of material removal in polishing in the overlapping evaluation regions was calculated as the amount of material removal in polishing for the overlap.

Next, on the basis of the amount of material removal in polishing determined from the flatness within each evaluation region, a polishing tool having a disk-shaped polishing plate of diameter 300 mm was used to carry out local polishing on the front or back surface of the intermediate substrate.

As a result, there was obtained a large-size synthetic quartz glass substrate having a flatness of 7 µm on the overall front surface, a flatness of 8 µm on the overall back surface, a parallelism of 9 µm on the overall substrate, a flatness within evaluation region of 2.8 µm at maximum, and a flatness difference of 0.4 µm at maximum.

Japanese Patent Application No. 2017-092330 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for evaluating the flatness of a large-size synthetic quartz glass substrate having front and back surfaces, the method comprising the steps of:
   partitioning an effective range into a plurality of evaluation regions such that the evaluation regions partly overlap each other, the effective range defined on one or both of the front and back surfaces of the large-size synthetic quartz glass substrate;
   measuring a flatness within each evaluation region; and
   computing a difference between the flatness in one evaluation region and the flatness in another evaluation region overlapping the one evaluation region, wherein
   the large-size synthetic quartz glass substrate has a diagonal length of at least 1,000 mm, and a thickness of 5 to 30 mm.

2. The method of claim 1, wherein the substrate is rectangular,
   the effective range is a rectangular range defined on the substrate surface by removing a band extending 10 mm from each side of the substrate surface, the rectangular range having two pairs of opposed sides, and
   the evaluation region is delineated by one pair of opposed sides of the effective range and two straight lines parallel to the other pair of opposed sides and has a width of 100 to 300 mm along the one pair of opposed sides.

3. The method of claim 1, wherein for each evaluation region, the area of the overlap between that evaluation region and the closest one of overlapping evaluation regions is 50 to 98% of the area of each evaluation region.

4. A method for manufacturing a large-size synthetic quartz glass substrate, comprising the steps of:
   evaluating the flatness of a large-size quartz glass substrate according to the method of claim 1,
   determining an amount of material removal in polishing on the basis of the measured flatness and flatness difference, and
   locally polishing the surface of the quartz glass substrate in accordance with the determined amount of material removal in polishing.

5. The method of claim 4, wherein the substrate is rectangular,
   the effective range is a rectangular range defined on the substrate surface by removing a band extending 10 mm from each side of the substrate surface, the rectangular range having two pairs of opposed sides, and
   the evaluation region is delineated by one pair of opposed sides of the effective range and two straight lines parallel to the other pair of opposed sides and has a width of 100 to 300 mm along the one pair of opposed sides.

6. The method of claim 4, wherein for each evaluation region, the area of the overlap between that evaluation region and the closest one of overlapping evaluation regions is 50 to 98% of the area of each evaluation region.

7. The method of claim 4, wherein the surface of the quartz glass substrate is locally polished in accordance with the determined amount of material removal in polishing so that a flatness in each evaluation region is up to 3 µm.

* * * * *